United States Patent
Kim et al.

(10) Patent No.: US 8,081,033 B2
(45) Date of Patent: Dec. 20, 2011

(54) VARIABLE GAIN AMPLIFIER AND HIGH-FREQUENCY SIGNAL RECEIVING APPARATUS COMPRISING THE SAME

(75) Inventors: Ryangsu Kim, Osaka (JP); George Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/107,598

(22) Filed: May 13, 2011

(65) Prior Publication Data
US 2011/0221531 A1 Sep. 15, 2011

Related U.S. Application Data (63) Continuation of application No. PCT/JP2009/002526, filed on Jun. 4, 2009.

(30) Foreign Application Priority Data

Jan. 13, 2009 (JP) ................................ 2009-004945

(51) Int. Cl.
*H03F 1/22* (2006.01)

(52) U.S. Cl. .......................... 330/311; 330/278; 330/284

(58) Field of Classification Search .......... 330/277–279, 330/282, 284, 311
See application file for complete search history.

(56) References Cited

U.S. PATENT DOCUMENTS

| 5,926,068 | A | 7/1999 | Harr | |
|---|---|---|---|---|
| 6,819,179 | B2* | 11/2004 | Raja et al. | 330/285 |
| 6,842,071 | B1 | 1/2005 | Retz et al. | |
| 7,889,008 | B2* | 2/2011 | Lee et al. | 330/311 |
| 7,902,925 | B2* | 3/2011 | Kim et al. | 330/311 |
| 2002/0171493 | A1 | 11/2002 | Tanabe | |
| 2007/0222515 | A1 | 9/2007 | Koutani et al. | |

FOREIGN PATENT DOCUMENTS

| JP | 02-089410 | 3/1990 |
|---|---|---|
| JP | 11-317635 | 11/1999 |
| JP | 2002-344266 | 11/2002 |
| JP | 2005-136846 | 5/2005 |
| JP | 2007-259297 | 10/2007 |
| JP | 2008-016927 | 1/2008 |
| WO | WO 2007/105282 A1 | 9/2007 |

* cited by examiner

*Primary Examiner* — Khanh Nguyen (74) *Attorney, Agent, or Firm* — McDermott Will & Emery LLP (57) ABSTRACT

A cascode amplification unit includes a plurality of cascode amplifiers connected in parallel. Each of the cascode amplifiers has two transistors. A cascode current source unit includes a plurality of cascode current sources connected in parallel. Each of the cascode current sources has two transistors. Both the output end of the cascode amplification unit and the output end of the cascode current source unit are connected to a load circuit. The control circuit turns on and off each cascode transistor of the cascode amplifier and each cascode transistor of the cascode current source so that an amount of current passing through the load circuit is constant.

16 Claims, 6 Drawing Sheets

VARIABLE GAIN AMPLIFIER AND HIGH-FREQUENCY SIGNAL RECEIVING APPARATUS COMPRISING THE SAME

CROSS-REFERENCE TO RELATED APPLICATION

This is a continuation of PCT International Application PCT/JP2009/002526 filed on Jun. 4, 2009, which claims priority to Japanese Patent Application No. 2009-004945 filed on Jan. 13, 2009. The disclosures of these applications including the specifications, the drawings, and the claims are hereby incorporated by reference in their entirety.

BACKGROUND

The present disclosure relates to a variable gain amplifier used for a wireless communication system, or the like, capable of amplifying a received signal with a desired gain.

In recent years, mobile phones offer not only a verbal communication function, but also wireless communication functions such as digital television, FM radio, Bluetooth (registered trademark), wireless LAN, and GPS. In order to meet the requirements of the miniaturization and price reduction of wireless communication devices and modules included therein, high-performance circuit systems which have not been integrated, are now integrated on a single wireless communication chip. Variable gain amplifiers for amplifying a high-frequency signal received with the antenna are one kind of such high-performance circuit systems.

In a wireless communication device, a variable gain amplifier amplifies a received signal inputted from the antenna without adding noise to the signal, and transmits the signal to the circuits that follow the variable gain amplifier. A variable gain amplifier is included in most wireless communication devices to achieve a reliable wireless communication.

When there is a longer distance between a wireless communication device and a base station, the intensity of the high-frequency signal received with the antenna is very low. In this case, the variable gain amplifier increases the gain. By contrast, when the distance therebetween is shorter, the intensity of the received signal is too high for the wireless communication device. In this case, the variable gain amplifier sets the gain to a value lower than 0 dB so that the output of the receiver does not become saturated. In order to demodulate a received signal, the variable gain amplifier needs best possible low-noise characteristics and linearity.

The Japanese terrestrial digital broadcasting service for mobile devices (ISDB-T, the so-called "1-SEG"), which has been spread rapidly, is characterized as its broadband transmission. An IC chip for receiving 1-SEG is often built in a mobile phone. Therefore, even with a high-frequency filter between the antenna and the 1-SEG tuner, various interfering waves within and outside the bandwidth are inputted into the tuner via the antenna and due to the radiation within the terminal. Furthermore, the gain of the variable gain amplifier has to be changed dynamically in order to improve communication quality. In recent years, both front-end elements (analog circuits) including a variable gain amplifier and back-end elements (digital circuits) including an OFDM demodulation unit are integrated into a single IC chip to reduce the mounting area and manufacturing cost of IC chips for receiving 1-SEG. Therefore, a high-performance variable gain amplifier having a smaller mounting area has to be manufactured at low costs by using CMOS manufacturing process, which has large process variations.

In conventional variable gain amplifiers, a plurality of cascode stage transistors connected in parallel with a power source and a load resistor are provided. The cascode stage transistors are selectively turned on and off to increase and decrease the gain while the amount of current passing through amplification transistors is constant (for example, see Japanese Patent Publication No. 2007-259297).

SUMMARY

Conventional variable gain amplifiers have employed the current steering method to vary their gains. When the gain is set to another value, the amount of DC current passing through the load resistor increases or decreases, thereby changing the output DC voltage. As a result, linearity is degraded at a low voltage operation. When one cascode amplifier is switched to another to set the gain to another value, one amplification stage transistor is switched to another, thereby displacing the input impedance of the variable gain amplifier from a desired value. Signals from the antenna cannot be received losslessly.

The mutual conductance gm of a bipolar transistor which has been used for signal amplification in conventional variable gain amplifiers is about four times as large as the gm of a MOS transistor under the same bias current conditions. Suppose that the same circuit topology is configured with MOS transistors instead of bipolar transistors, the MOS transistors need a current 16 times as much as in the case of bipolar transistors. This means that more electric power is consumed. Also, in conventional variable gain amplifiers, due to their configurations, as the number of cascode amplifiers increases, the parasitic capacitance becomes larger at the signal output end. Therefore, a larger number of cascode amplifiers significantly degrade frequency characteristics.

A first aspect of the present invention is to provide a variable gain amplifier which includes a plurality of cascode amplification units having one or more cascode amplifiers connected in parallel. Each of the cascode amplifiers has two transistors, and the input ends of the cascode amplification units are connected through a capacitor. The variable gain amplifier according to the first aspect further includes a cascode current source unit which has a plurality of cascode current sources connected in parallel. Each of the cascode current sources has two transistors. The variable gain amplifier according to the first aspect yet further includes a load circuit to which both output ends of the cascode amplification units and the output end of the cascode current source unit are connected. The variable gain amplifier according to the first aspect still further includes a control circuit configured to turn on and off each cascode transistor of each cascode amplifier and each cascode transistor of each cascode current source so that one of the cascode amplification units is operated, and so that the amount of current passing through the load circuit is constant.

A second aspect of the present invention is to provide a variable gain amplifier which includes a cascode amplification unit having a plurality of cascode amplifiers connected in parallel. Each of the cascode amplifiers has two transistors. The variable gain amplifier according to the second aspect further includes a cascode current source unit which has a plurality of cascode current sources connected in parallel. Each of the cascode current sources has two transistors. The variable gain amplifier according to the second aspect yet further includes a load circuit to which both the output end of the cascode amplification unit and the output end of the cascode current source unit are connected. The variable gain amplifier according to the second aspect still further includes a control circuit configured to turn on and off each cascode transistor of each cascode amplifier and each cascode transistor of each cascode current source so that the amount of current passing through the load circuit is constant.

According to these configurations, the gain of the variable gain amplifier changes while the amount of current passing through the load circuit is constant. Therefore, ringing in an output signal and linearity degradation at a low voltage operation are reduced. Furthermore, since the variable gain amplifier has a smaller number of transistors connected to the signal output end than conventional variable gain amplifiers, a smaller parasitic capacitance is produced, thereby reducing degradations in gain performance and noise factor across a wide frequency band.

Preferably, the variable gain amplifier according to the first aspect further includes: a DC-cut capacitor connected between the input end of the variable gain amplifier and the input end of one of the plurality of cascode amplification units; an attenuation circuit connected between the input end of the variable gain amplifier and ground, the attenuation circuit being configured to be switched between on and off; and a plurality of feedback circuits connected between the respective input and output ends of the plurality of cascode amplification units, each of the plurality of feedback circuits being configured to be switched between on and off. When a first cascode amplification unit included in the plurality of cascode amplification units is operated, the control circuit turns off the attenuation circuit, and turns on a feedback circuit included in the plurality of feedback circuits. In this case, the first cascode amplification unit is connected to the DC-cut capacitor, and the feedback circuit is connected between the input and output ends of the first cascode amplification unit. When one of the other cascode amplification units that follow the first amplification unit is operated, the control circuit turns on the attenuation circuit and another feedback circuit connected between the input and output ends of one of the other cascode amplification units different from the first cascode amplification unit.

Alternatively, the variable gain amplifier according to the first aspect further includes an attenuation circuit provided between an input end of a first cascode amplification unit and ground. The first cascode amplification unit is included in the plurality of cascode amplification units, and is connected to an outside DC-cut capacitor. The attenuation circuit is configured to be switched between on and off. The variable gain amplifier according to the first aspect yet further includes: a bias circuit connected to the input end of the first cascode amplification unit, the bias circuit being configured to be switched between on and off; and a plurality of feedback circuits connected between the respective input and output ends of the plurality of cascode amplification units, each of the plurality of feedback circuits being configured to be switched between on and off. When the first cascode amplification unit is operated, the control circuit turns off the attenuation circuit, and turns on the bias circuit and a feedback circuit connected between the input and output ends of the first cascode amplification unit. When one of the other cascode amplification units which follow the first cascode amplification unit is operated, the control circuit turns on the attenuation circuit and a feedback circuit connected between the input and output ends of the one of the other cascode amplification units, and turns off the bias circuit.

According to these configurations, the input impedance of the variable gain amplifier can be reduced to a desired value, so that impedance matching is easily performed with the antenna, the signal transmission line, or the like. Furthermore, even when one cascode amplification unit is switched to another, the input impedance of the variable gain amplifier can be kept at a desired value.

DETAILED DESCRIPTION

Hereinafter, embodiments of the present disclosure will be described with reference to the accompanying drawings.

First Embodiment

Figure 1:
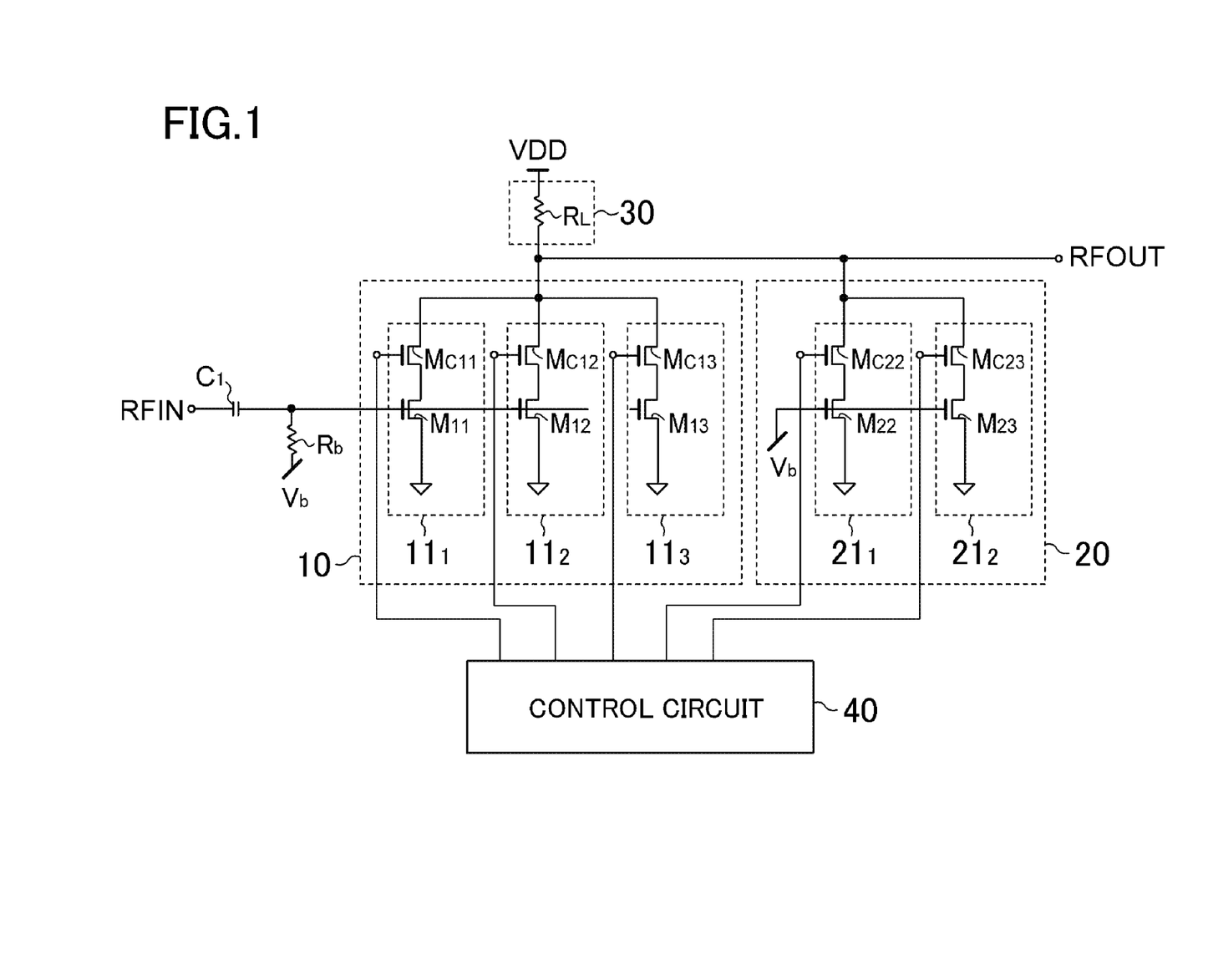
FIG. 1 is a configuration diagram illustrating a variable gain amplifier according to a first embodiment.

FIG. 1 is a configuration diagram illustrating a variable gain amplifier according to the first embodiment. A cascode amplification unit 10 includes three cascode amplifiers 11$n$ (n denotes an integer from 1 to 3) connected in parallel. Each cascode amplifier 11$n$ includes an NMOS transistor M1$n$ and an NMOS cascode transistor MC1$n$. The input end of the cascode amplification unit 10 is connected to the signal input end RFIN of the variable gain amplifier through a DC-cut capacitor C1. A bias voltage Vb is applied to the gate of each transistor M1$n$ through a bias resistor Rb. The size ratio of the transistor M12 to the transistor M13, and the size ratio of the cascode transistor MC12 to the cascode transistor MC13 are each 2:1, where each transistor size is defined by channel width/channel length.

A cascode current source unit 20 includes two cascode current sources 21$m$ (m denotes an integer from 2 or 3) connected in parallel. Each cascode current source 21$m$ includes an NMOS transistor M2$m$ and an NMOS cascode transistor MC2$m$. A bias voltage Vb is applied to the gate of each NMOS transistor M2$m$. The sizes of the transistor M22 and the cascode transistor MC22 are the same as the sizes of the transistor M12 and the cascode transistor MC12, respectively. The sizes of the transistor M23 and the cascode transistor MC23 are the same as the sizes of the transistor M13 and the cascode transistor MC13, respectively.

Both the output end of the cascode amplification unit 10 and the output end the cascode current source unit 20 are connected to a load circuit 30. The load circuit 30 includes a resistor RL. The connecting point at which the output end of the cascode amplification unit 10, the output end of the cascode current source unit 20, and the load circuit 30 are connected together is a signal output end RFOUT of the variable gain amplifier.

There is provided a control circuit 40 which controls each gate voltage of the cascode transistor MC1$n$ and the cascode transistor MC2$m$ separately to switch each cascode transistor between on and off states. Specifically, the control circuit 40 turns each cascode transistor off by applying a voltage equal to the ground potential, to the gate of the cascode transistor. On the other hand, the control circuit 40 turns each cascode transistor on by apply a predetermined voltage to the gate of the cascode transistor. In this case, the respective cascode transistors are turned on at the same gate voltages.

Next, a description is given for an operation of the variable gain amplifier according to the first embodiment. A high-frequency signal is inputted into the signal input end RFIN, and the DC component thereof is cut off by the DC-cut capacitor C1. The high-frequency signal is then inputted into the gate of the transistor M1n, to which a bias voltage Vb has been applied. In order to set the gain of the variable gain amplifier to a maximum value, the control circuit 40 turns all the cascode transistors MC1n on, and turns all the cascode transistors MC2m off.

In order to switch the gain of the variable gain amplifier from its maximum value to the next lower level, the control circuit 40 turns the cascode transistor MC13 off, and turns the cascode transistor MC23 on. The sizes of the cascode transistors MC13 and MC23 are the same. The sizes of the transistors M13 and M23 are also the same. Therefore, the lower gain does not affect the amount of DC current passing through the load circuit 30. Since the voltage of the signal output end RFOUT does not change at the time of gain switching, the variable gain amplifier according to this embodiment reduces ringing in an output signal and linearity degradation at a low voltage operation. In addition, the variable gain amplifier according to this embodiment has a smaller number of transistors connected to the signal output end RFOUT than conventional variable gain amplifiers, thereby producing a smaller parasitic capacitance. As a result, degradations in gain performance and noise factor are reduced across a wide frequency band.

In order to switch the gain of the variable gain amplifier to a further lower level, the control circuit 40 turns the cascode transistor MC12 off, and turns the cascode transistor MC22 on. In order to set the gain to a minimum value, the control circuit 40 turns the cascode transistor MC1m off, and turns the cascode transistor MC2m on. The cascode transistor MC11 is preferably held in on-state even when the gain is switched. In this case, the cascode transistor MC11 is turned off only when the variable gain amplifier is powered down.

As described above, in the variable gain amplifier according to the first embodiment, the voltage of the signal output end does not change at the time of gain switching, thereby reducing ringing in an output signal and linearity degradation at a low voltage operation. All the transistors and the cascode transistors may have a PMOS structure. In this case, the load circuit 30 is grounded. The transistors M1n and the transistors M2m may be bipolar transistors. A larger number of cascode amplifiers 11n and cascode current sources 21m connected in parallel enable a smaller gain switching step and a wider variable gain range.

Second Embodiment

Variable gain amplifiers have to receive a signal as losslessly as possible regardless of the intensity of the signal inputted from the antenna. Therefore, the input impedance of a variable gain amplifier preferably has the same value as the characteristic impedance of the antenna (typically, 50Ω or 75Ω for TV receiver).

Figure 2:
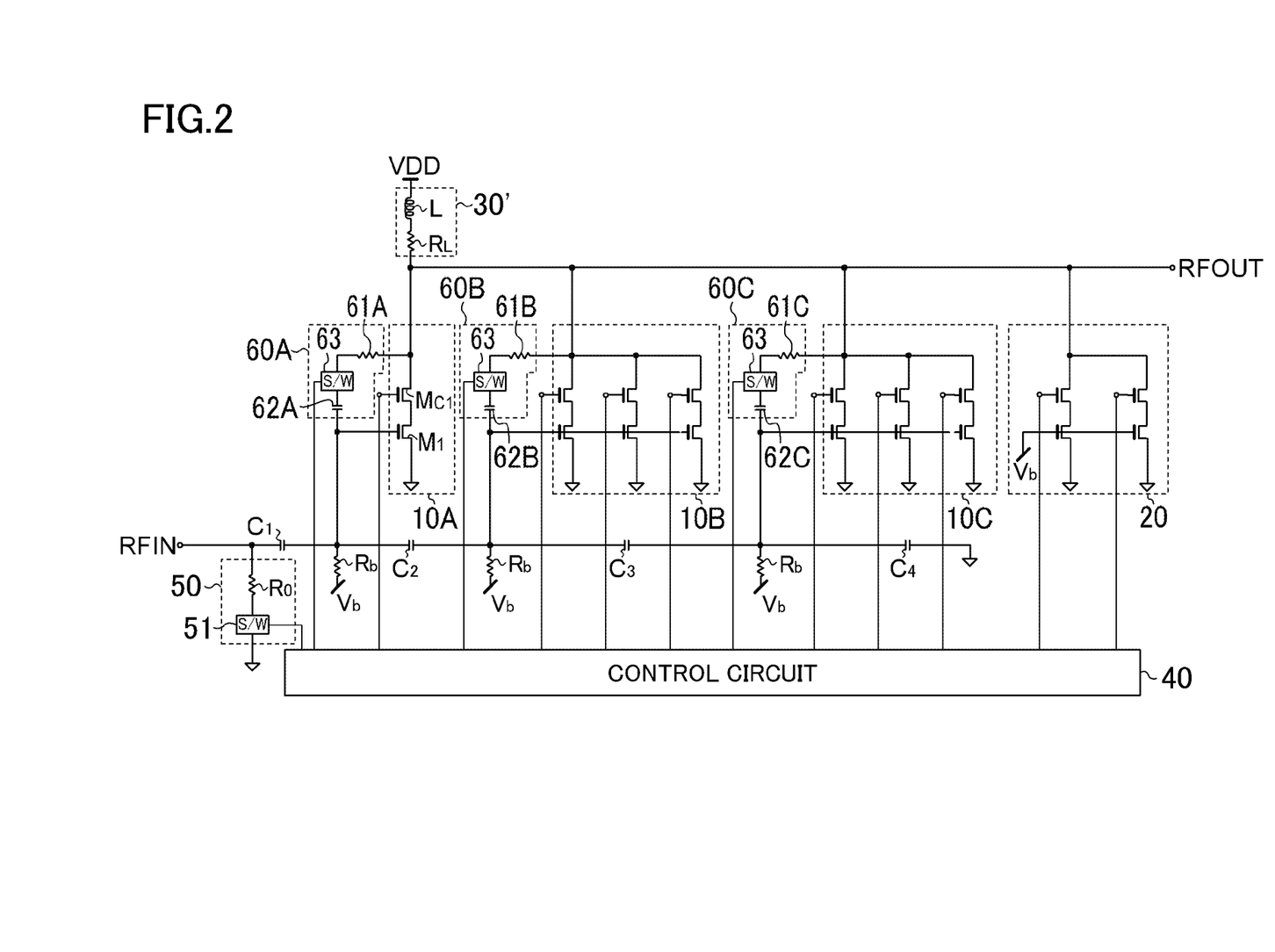
FIG. 2 is a configuration diagram illustrating a variable gain amplifier according to a second embodiment.

FIG. 2 is a configuration diagram illustrating a variable gain amplifier according to a second embodiment. The variable gain amplifier according to the second embodiment is configured so that the variations in input impedance at the time of gain switching are smaller. Hereinafter, a description is given only for the parts different from the corresponding parts in the first embodiment.

The variable gain amplifier according to the second embodiment includes three cascode amplification units 10A, 10B, and 10C. The cascode amplification units 10B and 10C has the same configuration as the cascode amplification unit 10 illustrated in FIG. 1. The cascode amplification unit 10A includes a single cascode amplifier having an NMOS transistor M1 and an NMOS cascode transistor MC1. The cascode transistor MC1 is turned on and off by a control circuit 40. The size of the transistor M1 is equal to the total size of the transistors M1n illustrated in FIG. 1. The size of the cascode transistor MC1 is equal to the total size of the cascode transistors MC1n illustrated in FIG. 1.

The input end of the cascode amplification unit 10A is connected to the input end of the cascode amplification unit 10B through a signal attenuating capacitor C2. The input end of the cascode amplification unit 10B is connected to the input end of the cascode amplification unit 10C through a signal attenuating capacitor C3. A signal attenuating capacitor C4 is connected between a capacitor C3 and the ground.

Both the output ends of the three cascode amplification units 10A to 10C and the output end of the cascode current source unit 20 are connected to a load circuit 30'. The load circuit 30' includes a resistor RL and an inductor L which are connected in series. The inductor L enables a wider variable gain range of the variable gain amplifier.

An attenuation circuit 50 is connected to the signal input end RFIN of the variable gain amplifier. The attenuation circuit 50 includes a resistor RO and a switch 51 controlled by a control circuit 40 connected in series. The switch 51 is, for example, a transfer gate.

Between the input and output ends of each of the cascode amplification units 10A to 10C, feedback circuits 60A, 60B, and 60C are connected, respectively. The feedback circuit 60A includes a resistor 61A, a DC-cut capacitor 62A, and a switch 63 which are connected in series. The switch 63 is controlled by the control circuit 40. The feedback circuits 60B and 60C have the same configuration as the feedback circuit 60A. The switch 63 is, for example, a transfer gate.

The control circuit 40 selects one for operation from the three cascode amplification units 10A to 10C so that the variable gain amplifier has a desired gain. The control circuit 40 also turns on and off each cascode transistor of each cascode amplifier and each cascode transistor of each cascode current source so that the amount of DC current passing through the load circuit 30' is constant.

Next, a description is given for an operation of the variable gain amplifier according to the second embodiment. In order to set the gain of the variable gain amplifier to a maximum value, the control circuit 40 turns on the cascode transistor MC1 of the cascode amplification unit 10A (the first cascode amplifier) and the feedback circuit 60A connected to the cascode amplification unit 10A, and turns off the other cascode transistors, the feedback circuits 60B and 60C, and the attenuation circuit 50. All the cascode transistors of the cascode current source unit 20 are turned off, so that the total amount of current flows in the cascode amplification unit 10A from the power source through the load circuit 30'.

The gain is set to a maximum value when a received signal is as weak as the minimum receiving sensitivity. In this case, the noise factor of the variable gain amplifier is preferably as small as possible. Therefore, since the cascode amplification unit 10A is composed of two transistors, that is, one cascode amplifier, the transistor layout area is saved, thereby reducing parasitic capacitance and parasitic resistance.

The input impedance Zin of the variable gain amplifier at its maximum value is approximated by the following equation 1.

$$Z_{in} = \frac{R_L + R_{f1}}{1 + g_m R_L} \quad \text{[Equation 1]}$$

where RL represents the resistance value of the resistor RL, Rf1 represents the resistance value of the resistor 61A, and gm represents the mutual conductance of the transistor M1. The reactance component is ignored here.

According to Equation 1, the input impedance of the variable gain amplifier is determined by the size of the transistor M1, bias current, load resistance value, and feedback resistance value. The resistor feedback makes the input impedance of the variable gain amplifier smaller than the gate impedance of a MOS transistor. This effect is preferably used so that the input impedance of the variable gain amplifier is almost equal to the characteristic impedance of the antenna across the entire bandwidth.

The element sizes and operating conditions are preferably designed so that the gain is constant to the extent possible and the noise factor has a minimum value across the entire bandwidth. The gain G of the variable gain amplifier during maximum gain operation is approximated by the following equation 2.

$$G = \frac{R_L(1 - g_m R_{f1})}{R_L + R_{f1}} \quad \text{[Equation 2]}$$

According to Equation 2, the gain of the variable gain amplifier is also determined by the size of the transistor M1, bias current, load resistance value, and feedback resistance value. Therefore, the input impedance and gain of the variable gain amplifier can be optimized.

When the gain is switched from the maximum value to the next lower level, the control circuit 40 turns on all the cascode transistors of the cascode amplification unit 10B and the feedback circuit 60B connected to the cascode amplification unit 10B, and turns off the other cascode transistors and the feedback circuits 60A and 60C. The high-frequency signal inputted into the signal input end RFIN is DC-cut by the DC-cut capacitor C1 and attenuated by the capacitor C2. The high-frequency signal is then inputted into the cascode amplification unit 10B.

The problem here is that the input impedance becomes larger than the antenna characteristic impedance when the gain and the noise factor are set to desired values. As a result, an inputted signal is reflected toward the antenna, and lost. Therefore, the control circuit 40 turns on the attenuation circuit 50 when either one of the cascode amplification units other than the cascode amplification unit 10A is operated. The input impedance of the variable gain amplifier depends on the resistance value of the resistor RO of the attenuation circuit 50. Accordingly, the resistance values of the resistor RO and the resistors 61A to 61C are preferably determined so that the input impedance of the variable gain amplifier obtained by operating either one of the cascode amplification units other than the cascode amplification unit 10A is almost equal to the antenna characteristic impedance.

When the gain is switched to a further lower level, the control circuit 40 turns on and off each cascode transistor of the cascode amplification unit 10B and each cascode transistor of the cascode current source unit 20 as required. The detailed description has been given in the first embodiment.

As described above, in the variable gain amplifier according to the second embodiment, the noise factor can be reduced when the variable gain amplifier is operated at the maximum gain value. The resistor feedback enables the variable gain range to be wider, and the input impedance to be almost as small as the antenna characteristic impedance. Even when one cascode amplification unit is switched to another in response to the inputted signal intensity, the input impedance of the variable gain amplifier can be kept at a desired value. Furthermore, since the inputted signal is attenuated to the full extent, the linearity degradation of the variable gain amplifier can be reduced.

Figure 3:
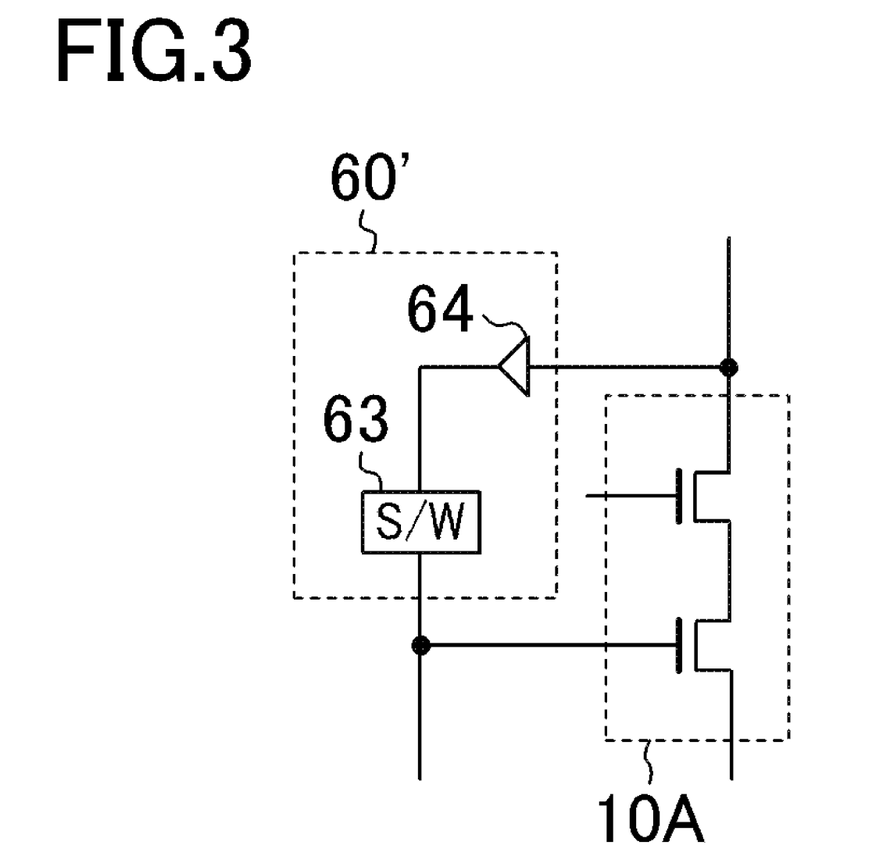
FIG. 3 is a configuration diagram illustrating a feedback circuit.

Instead of the feedback circuits 60A to 60C, as illustrated in FIG. 3, a feedback circuit 60' including a buffer circuit 64 and a switch 63 connected in series may be employed. In this case, the buffer circuit 64 receives the output of each cascode amplification unit, and the switch 63 is controlled by the control circuit 40. Also with the feedback circuit 60', the input impedance of the variable gain amplifier is almost as small as the antenna characteristic impedance.

Third Embodiment

In a CMOS structure, there is a large parasitic capacitance between a capacitor and the silicon substrate. Therefore, the resistance component of the substrate degrades the S/N characteristics of a high-frequency signal. Specifically, in the case where the DC-cut capacitor C1 illustrated in FIG. 2 is provided within the integrated circuit, the noise factor is degraded during maximum gain operation. Therefore, the DC-cut capacitor C1 is preferably provided outside the integrated circuit.

Figure 4:
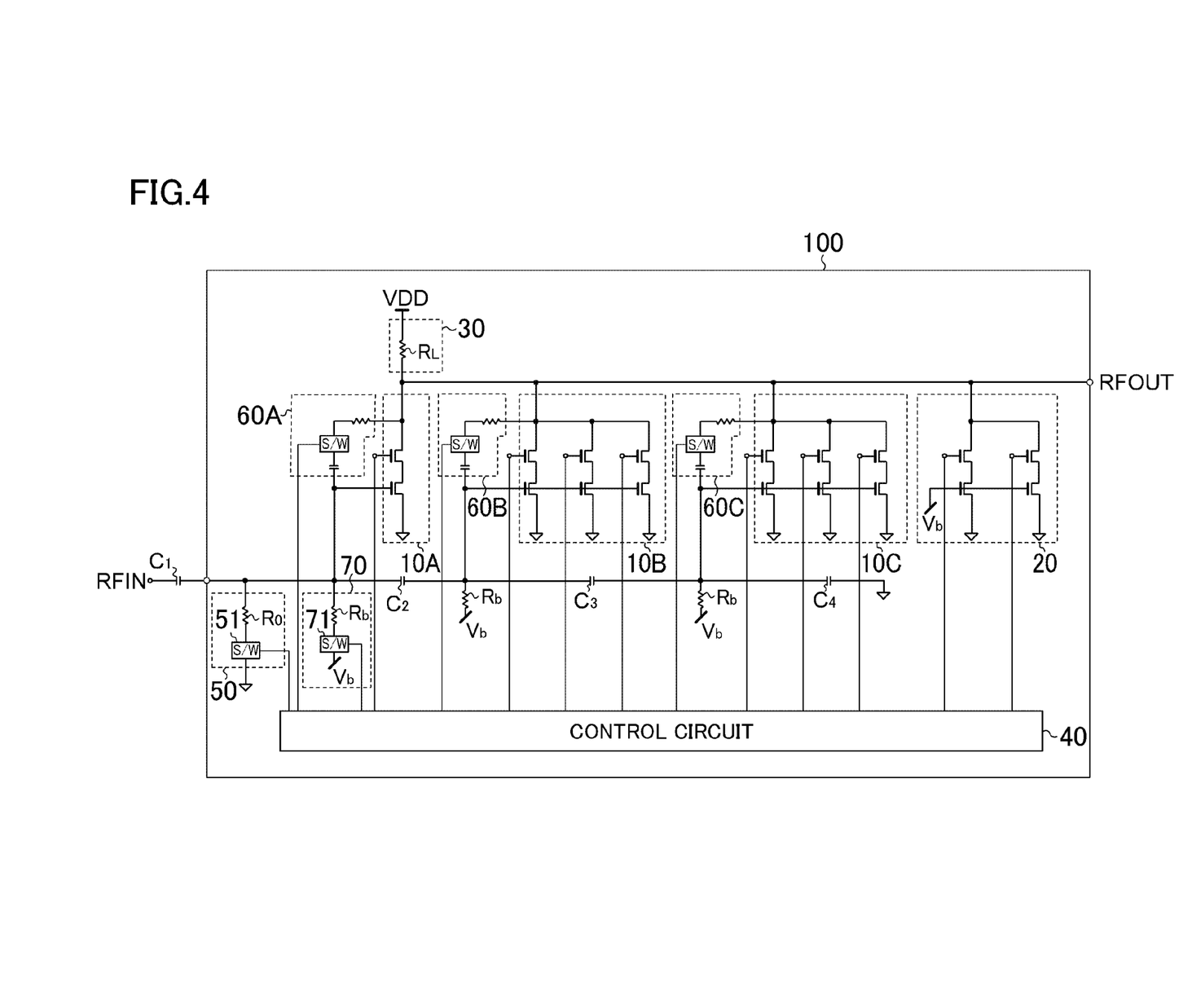
FIG. 4 is a configuration diagram illustrating a variable gain amplifier according to a third embodiment.

FIG. 4 illustrates a configuration of a variable gain amplifier according to a third embodiment. In the variable gain amplifier according to the third embodiment, the configuration elements of the variable gain amplifier illustrated in FIG. 2 except the DC-cut capacitor C1 are provided in an integrated circuit 100, and the DC-cut capacitor C1 is provided outside the integrated circuit 100. The DC-cut capacitor C1 may be provided on a printed board, in a module, or in a package.

In the configuration where the DC-cut capacitor C1 is provided simply outside the integrated circuit, when the switch 51 is turned on, a leakage current passes through the bias resistor Rb and the resistor R0 which are connected to the input end of the cascode amplification unit 10A. This undesirable leakage current increases particularly during high temperature operation. This is because the threshold of each transistor included in the switch 51 decreases and because the on-resistance thereof also decreases. In order to solve this problem, a switch 71 is connected in series with the resistor Rb. Specifically, a bias circuit 70 includes the resistor Rb and the switch 71 which are connected in series. The switch 71 is controlled by the control circuit 40. The control circuit 40 turns off the switch 71 to turn on the switch 51. This configuration reduces the leakage current.

As described above, in the variable gain amplifier according to the third embodiment, the DC-cut capacitor C1 having a high Q value can reduce the degradation in the S/N characteristics of an inputted signal.

Fourth Embodiment

A MOS transistor has a smaller mutual conductance gm than the gm of a bipolar transistor under the same bias current conditions. Therefore, it is difficult to achieve a desired variable gain range (typically, about 40 dB) only by using the variable gain amplifier of each embodiment, without degradations in linearity and noise factor while reducing electric current consumption to the extent possible.

Figure 5:
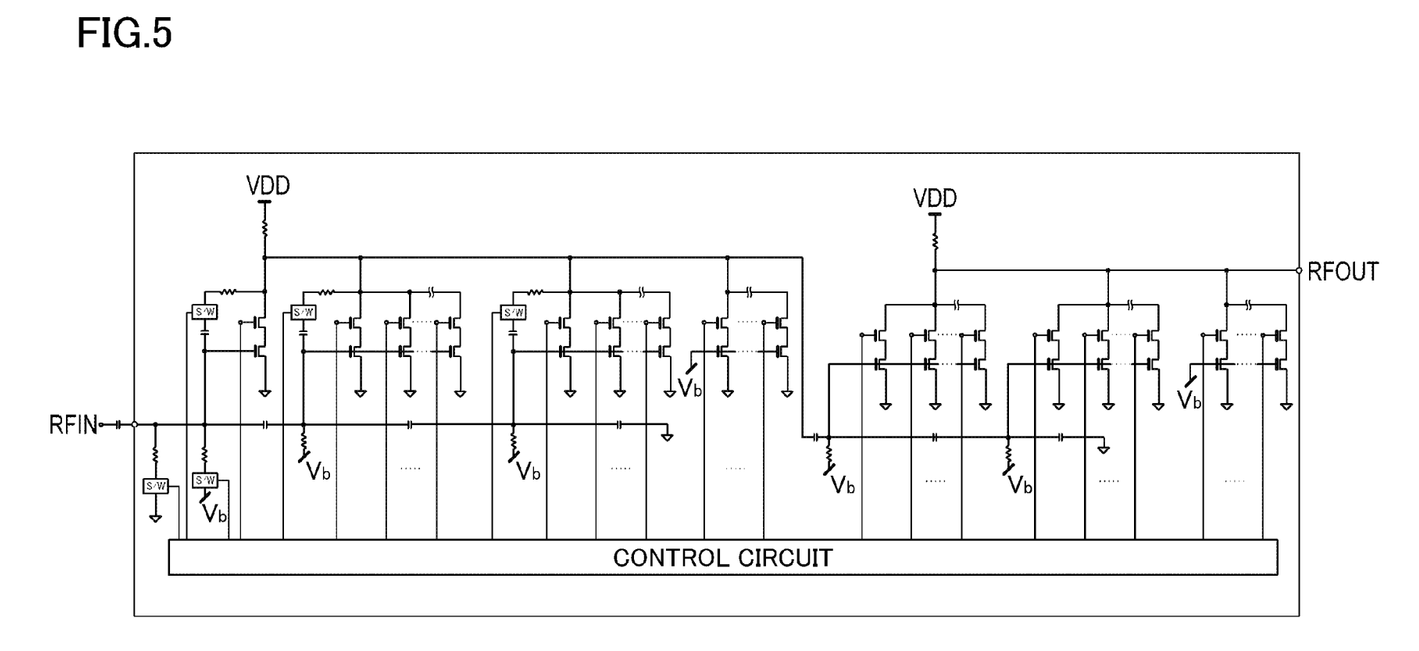
FIG. 5 is a configuration diagram illustrating a variable gain amplifier according to a fourth embodiment.

FIG. 5 illustrates a configuration of a variable gain amplifier according to a fourth embodiment. The variable gain amplifier according to the fourth embodiment includes a variable gain amplifier illustrated in FIG. 4 having a feedback circuit, and a variable gain amplifier illustrated in FIG. 1 having no feedback circuit. The variable gain amplifiers are cascade-connected to each other. Preferably, the first variable gain amplifier has a larger gain switching step, and the second variable gain amplifier has a smaller gain switching step. This reduces degradations in noise characteristics, linearity, and, input impedance even when the variable gain range is enlarged.

(Embodiment of High-Frequency Signal Receiver)

Figure 6:
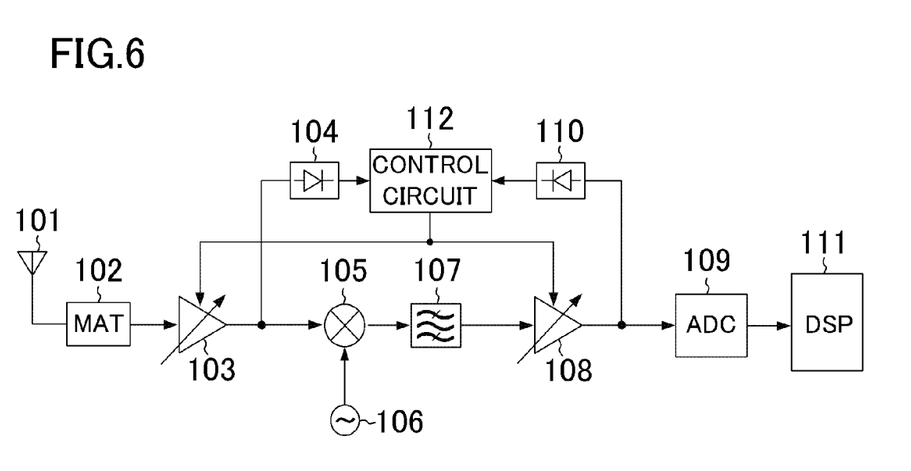
FIG. 6 is a configuration diagram illustrating a high-frequency signal receiver.

FIG. 6 illustrates a high-frequency signal receiver according to one embodiment. Examples of the high-frequency signal receiver corresponds to, for example, a 1-SEG tuner, a ultra-wide band (UWB) communication device, or the like. A high-frequency signal is received by an antenna 101. The signal is then inputted into a variable gain low-noise amplifier 103 through a matching circuit 102. The signal is amplified by the variable gain low-noise amplifier 103, and then inputted into a high-frequency power detection circuit 104 and a mixer 105. The mixer 105 mixes an output of the variable gain low-noise amplifier 103 and a local signal outputted from a local signal generator 106, to convert the signal to have an intermediate frequency (IF). An output of the mixer 105 is inputted into a variable gain IF amplifier 108 through an IF bandpass filter 107. The signal is amplified by the variable gain IF amplifier 108, and then inputted into an A/D converter 109 and an IF power detection circuit 110. The A/D converter 109 converts the inputted signal into a digital signal. A digital signal processor 111 demodulates the digital output of the A/D converter 109.

A control circuit 112 sets the gains of the variable gain low-noise amplifier 103 and a variable gain IF amplifier 108 to other values, according to the respective results detected by the high-frequency power detection circuit 104 and the IF power detection circuit 110. For example, when the power level of a received signal rises from the minimum receiving sensitivity level, the control circuit 112 performs optimization control. Specifically, the control circuit 112 sets the gain of the variable gain IF amplifier 110 to a lower value and then sets the gain of the variable gain low-noise amplifier 103 to a lower value, so that the signal to be inputted into the A/D converter 109 is not distorted. On the other hand, when the power level of a received signal falls from the maximum allowable input level, the control circuit 112 also performs optimization control. In this case, the control circuit 112 sets the gain of the variable gain low-noise amplifier 103 to a higher value at which the signal to be inputted into the A/D converter 109 is not distorted, and then sets the gain of the variable gain IF amplifier 110 to a higher value.

In the above high-frequency signal receiver, the variable gain amplifier according to each of the above embodiments is applicable to the part including the variable gain low-noise amplifier 103 and the control circuit 112. This configuration achieves a high-frequency signal receiver better in performance which is operable at a low voltage.

What is claimed is:

1. A variable gain amplifier comprising:
   a plurality of cascode amplification units each of which includes either one or more cascode amplifiers connected in parallel, each of the cascode amplifiers having two transistors, input ends of the plurality of cascode amplification units being connected through a capacitor;
   a cascode current source unit including a plurality of cascode current sources connected in parallel, each of the cascode current sources having two transistors;
   a load circuit to which both output ends of the plurality of cascode amplification units and an output end of the cascode current source unit are connected; and
   a control circuit configured to turn on and off each cascode transistor of each cascode amplifier and each cascode transistor of each cascode current source so that one of the plurality of cascode amplification units is operated, and so that an amount of current passing through the load circuit is constant.

2. The variable gain amplifier of claim 1, further comprising:
   a DC-cut capacitor connected between an input end of the variable gain amplifier and the input end of one of the plurality of cascode amplification units;
   an attenuation circuit connected between the input end of the variable gain amplifier and ground, the attenuation circuit being configured to switched between on and off; and
   a plurality of feedback circuits connected between the respective input and output ends of the plurality of cascode amplification units, each of the plurality of feedback circuits being configured to switched between on and off, wherein
   when a first cascode amplification unit included in the plurality of cascode amplification units is operated, the control circuit turns off the attenuation circuit, and turns on a feedback circuit included in the plurality of feedback circuits, the feedback circuit connected between the input and output ends of the first cascode amplification unit, the first cascode amplification unit being connected to the DC-cut capacitor, and
   when one of other cascode amplification units which follow the first cascode amplification unit is operated, the control circuit turns on the attenuation circuit and another feedback circuit connected between input and output ends of the one of the other cascode amplification units different from the first cascode amplification unit.

3. The variable gain amplifier of claim 1, further comprising:
   an attenuation circuit provided between an input end of a first cascode amplification unit included in the plurality of cascode amplification units and ground, the first cascode amplification unit being connected to an outside DC-cut capacitor, the attenuation circuit being configured to be switched between on and off;
   a bias circuit connected to the input end of the first cascode amplification unit, the bias circuit being configured to be switched between on and off; and
   a plurality of feedback circuits connected between the respective input and output ends of the plurality of cascode amplification units, each of the plurality of feedback circuits being configured to be switched between on and off, wherein
   when the first cascode amplification unit is operated, the control circuit turns off the attenuation circuit, and turns on the bias circuit and a feedback circuit connected between input and output ends of the first cascode amplification unit, and
   when one of other cascode amplification units which follow the first cascode amplification unit is operated, the control circuit turns on the attenuation circuit and a feedback circuit connected between input and output ends of the one of the other cascode amplification units, and turns off the bias circuit.

4. The variable gain amplifier of claim 2, wherein each of the plurality of feedback circuits includes a resistor, a capacitor, and a switch controlled by the control circuit, which are connected in series.

5. The variable gain amplifier of claim 3, wherein each of the plurality of feedback circuits includes a resistor, a capacitor, and a switch controlled by the control circuit, which are connected in series.

6. The variable gain amplifier of claim 2, wherein each of the plurality of feedback circuits includes a buffer circuit into which an output of the cascode amplification unit is inputted, and a switch controlled by the control circuit, the buffer circuit and the switch being connected in series.

7. The variable gain amplifier of claim 3, wherein each of the plurality of feedback circuits includes a buffer circuit into which an output of the cascode amplification unit is inputted, and a switch controlled by the control circuit, the buffer circuit and the switch being connected in series.

8. The variable gain amplifier of claim 1, wherein the load circuit includes either one of a single resistor or a combination of a resistor and an inductor which are connected in series.

9. The variable gain amplifier of claim 2, wherein the load circuit includes either one of a single resistor or a combination of a resistor and an inductor which are connected in series.

10. The variable gain amplifier of claim 3, wherein the load circuit includes either one of a single resistor or a combination of a resistor and an inductor which are connected in series.

11. The variable gain amplifier of claim 2, wherein the attenuation circuit includes a resistor and a switch controlled by the control circuit, which are connected in series.

12. The variable gain amplifier of claim 3, wherein the attenuation circuit includes a resistor and a switch controlled by the control circuit, which are connected in series.

13. The variable gain amplifier of claim 3, wherein the bias circuit includes a resistor and a switch controlled by the control circuit, which are connected in series.

14. A high-frequency signal receiver comprising the variable gain amplifier of claim 1.

15. A variable gain amplifier comprising:
 a cascode amplification unit including a plurality of cascode amplifiers each of which has two transistors, the plurality of cascode amplifiers being connected in parallel;
 a cascode current source unit including a plurality of cascode current sources each of which has two transistors, the plurality of cascode current sources being connected in parallel;
 a load circuit to which both an output end of the cascode amplification unit and an output end of the cascode current source unit are connected; and
 a control circuit configured to turn on and off each cascode transistor of the cascode amplifier and each cascode transistor of the cascode current source so that an amount of current passing through the load circuit is constant.

16. A high-frequency signal receiver comprising the variable gain amplifier of claim 15.

* * * * *